(12) United States Patent
Kim

(10) Patent No.: US 7,588,985 B2
(45) Date of Patent: Sep. 15, 2009

(54) METHOD FOR FABRICATING FIN TRANSISTOR

(75) Inventor: Kwang-Ok Kim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 258 days.

(21) Appl. No.: 11/617,579

(22) Filed: Dec. 28, 2006

(65) Prior Publication Data
US 2008/0081420 A1    Apr. 3, 2008

(30) Foreign Application Priority Data
Sep. 29, 2006    (KR)    ........................ 10-2006-0096468

(51) Int. Cl.
*H01L 21/336* (2006.01)
(52) U.S. Cl. .................. 438/270; 438/268; 438/283; 438/589; 257/E29.321; 257/E21.384
(58) Field of Classification Search ................. 438/268, 438/589, 270, 283; 257/E21.384, E21.419, 257/E29.321
See application file for complete search history.

(56) References Cited

U.S. PATENT DOCUMENTS 7,056,781 B2    6/2006    Yoon et al.

| 2001/0026996 A1* | 10/2001 | Ishitsuka et al. | 438/437 |
|---|---|---|---|
| 2003/0114003 A1* | 6/2003 | Kwean et al. | 438/689 |
| 2004/0135198 A1* | 7/2004 | Murahama | 257/330 |
| 2004/0245596 A1* | 12/2004 | Sugihara | 257/499 |
| 2005/0153490 A1* | 7/2005 | Yoon et al. | 438/164 |
| 2005/0170593 A1* | 8/2005 | Kang et al. | 438/296 |
| 2005/0173759 A1* | 8/2005 | Kim et al. | 257/331 |
| 2005/0186746 A1* | 8/2005 | Lee et al. | 438/300 |
| 2007/0155148 A1* | 7/2007 | Kim | 438/589 |

FOREIGN PATENT DOCUMENTS

| KR | 10-2005-0079270 A | 8/2005 |
|---|---|---|
| KR | 10-2005-0083305 A | 8/2005 |
| KR | 1020050103810 A | 11/2005 |

\* cited by examiner

*Primary Examiner*—Thanh V Pham
*Assistant Examiner*—Duy T Nguyen
(74) *Attorney, Agent, or Firm*—Townsend and Townsend and Crew LLP

(57) ABSTRACT

A method for fabricating a fin transistor includes patterning a first pad layer provided over a substrate using an isolation mask, etching the substrate using the isolation mask and the first pad layer to form trenches, filling the trenches with an insulating material to form isolation structures, etching the isolation structures within the trenches using a gas having a high selectivity ratio of the insulating material to the first pad layer to form fin structures, forming a gate insulating layer over the fin structures, and forming a conductive layer over the gate insulating layer.

12 Claims, 13 Drawing Sheets

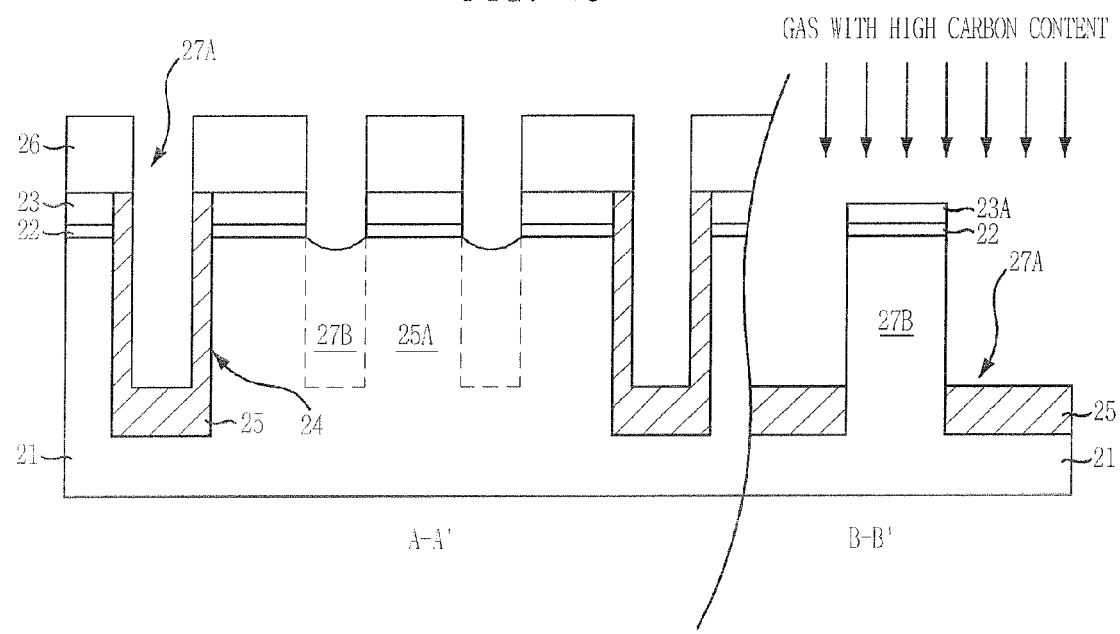
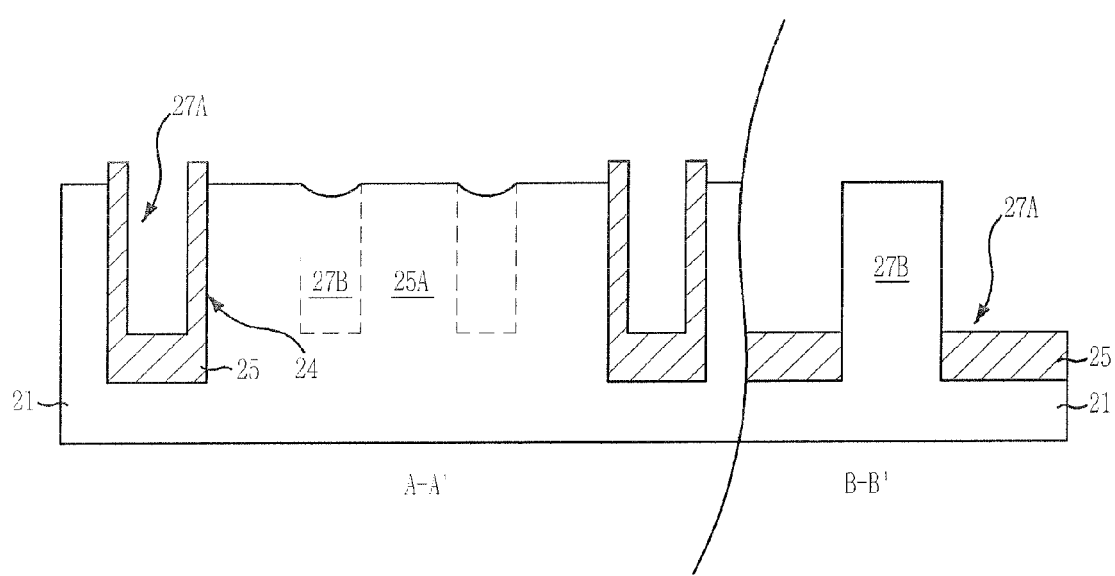

METHOD FOR FABRICATING FIN TRANSISTOR

CROSS-REFERENCE TO RELATED APPLICATIONS

The present invention claims priority of Korean patent application number 10-2006-0096468, filed on Sep. 29, 2006, which is incorporated by reference in its entirety.

BACKGROUND OF THE INVENTION

The present invention relates to a method for fabricating a semiconductor device, and more particularly, to a method for fabricating a fin transistor.

As semiconductor devices become highly integrated, conventional two-dimensional transistor structures have some limitations. In particular, for high-speed devices, two-dimensional transistor structures often do not satisfy the required current drive.

Fin field effect transistors (FETs) and saddle-type fin FETs are two examples that attempt to overcome the aforementioned limitation. These fin FETS and saddle-type fin FETs usually uses three surfaces as channels, and thus, they provide good current drive, and improve back bias dependency.

FIGS. 1A to 1D are cross-sectional views illustrating a method for fabricating a fin transistor. FIG. 2 illustrates a top view of the fin transistor fabricated by the method described in FIGS. 1A to 1D. In FIGS. 1A to 1D and FIG. 2, cut plane X-X' is directed along a major axis of an active region 15A, while cut plane Y-Y' is directed along a region where gate electrodes 19 are to be formed.

Referring to FIG. 1A, a pad oxide layer 12 and a pad nitride layer 13 are formed on a substrate 11, and etched using an isolation mask (not shown). The substrate 11 is etched to a certain depth using the pad nitride layer 13 as an etch barrier to form trenches 14. Referring to FIG. 1B, an oxide layer is deposited until the trenches 14 are filled. The wafer is then subjected to a chemical mechanical polishing (CMP) to form field oxide layers 15. The field oxide layers 15 are used for isolation and define an active region 15A. Referring to FIG. 1C, a line type fin mask 16 is formed over certain regions of the resultant structure illustrated in FIG. 1C. The field oxide layers 15 are recessed to a certain depth using the fin mask 16 as an etch barrier to form fins 17B. Reference numeral 17A denotes recesses obtained after the field oxide layers 15 are recessed. Referring to FIG. 1D, the fin mask 16 is removed, and a gate oxide layer 18 and a gate electrode layer (not shown) are formed and patterned to form gate electrodes 19.

When the fins 17B are formed, the top portions of the fins 17B are often damaged. Particularly, when the field oxide layers 15 are etched, the top portions of the fins 17B are often etched away. As illustrated in FIG. 1C, the loss may occur in the top and lateral directions T and L.

FIG. 3A illustrates an image of a fin with a damaged top portion. Due to the loss of the top portion of the fin, a tapered top is generated. As mentioned, the loss of the top portion of the fin is generally incurred when the field oxide layer is etched using an oxide etching gas. Particularly, the loss of the top portion of the fin is usually incurred when the pad nitride layer 13 does not sufficiently function as an etch barrier because of the oxide etching gas.

A fin is in a region where the channel is to be formed and generally determines the shape of the transistor. If a fin has a small critical dimension (CD), the loss of the top portion of the fin often leads to a decrease in the CD of the fin. Thus, if the fin is likely to be sharply tapered, it may make it difficult to achieve the desired CD reproducibility of a channel.

As similar to the aforementioned loss of the top portion of the fin, when a saddle-type fin pattern for a saddle-type fin FET is formed, the top portion of the fin pattern is likely to be damaged. Also, as the recessed depth of the field oxide layer to form a fin or a saddle-type fin pattern increases, the loss of the top portion of the fin or the saddle-type fin pattern tends to increase. FIG. 3B illustrates an image of a damaged saddle-type fin. Due to the severe damage (loss), the saddle-type fin pattern often exhibits a tapered top portion.

SUMMARY OF THE INVENTION

An embodiment of the present invention is directed towards a method for fabricating a fin transistor suitable for reducing damage to a top portion of a fin during recessing of the isolation layer.

Another embodiment of the present invention is directed towards a method for fabricating a saddle-type fin transistor suitable for reducing damage to a top portion of the saddle-type fin.

In accordance with one aspect of the present invention, there is provided a method for fabricating a fin transistor. The method includes patterning first pad layer provided over a substrate using an isolation mask. The substrate is etched using the isolation mask and the first pad layer to form trenches. The trenches are filled with an insulating material to form isolation structures. The isolation structures are etched within the trenches using a gas having a high selectivity ratio of the insulating material to the first pad layer to form fin structures. A gate insulating layer is formed over the fin structures. A conductive layer is formed over the gate insulating layer.

In accordance with another aspect of the present invention, there is provided a method for fabricating a saddle-type fin transistor. The method includes forming a pad layer over a substrate; etching a substrate to form first and second trenches, the first and second trenches defining a portion of the substrate therebetween; filling the first and second trenches with an isolation material to form first and second isolation structures, respectively, wherein the pad layer is provided over the portion of the substrate; etching the first and second isolation structures using a gas having a high selectivity ratio of the isolation material to the pad layer, so that the portion of the substrate protrudes above an upper surface of the etched first and second isolation structures; removing the pad layer to expose an upper surface of the portion of the substrate; and etching the portion of the substrate to reduce the height of the portion to form a saddle-type fin.

BRIEF DESCRIPTION OF THE DRAWINGS

FIGS. 4A to 4E are cross-sectional views illustrating a method for fabricating a fin transistor in accordance with an embodiment of the present invention.

DESCRIPTION OF SPECIFIC EMBODIMENTS

FIGS. 4A to 4E are cross-sectional views illustrating a method for fabricating a fin transistor in accordance with an embodiment of the present invention. FIG. 5 illustrates a top view of the fin transistor fabricated by the method illustrated in FIGS. 4A to 4E. In FIGS. 4A to 4E and FIG. 5, cut plane A-A' is directed along a major axis of an active region 25A, while cut plane B-B' is directed along a region where gate electrodes 29 are to be formed.

Figure 1A:
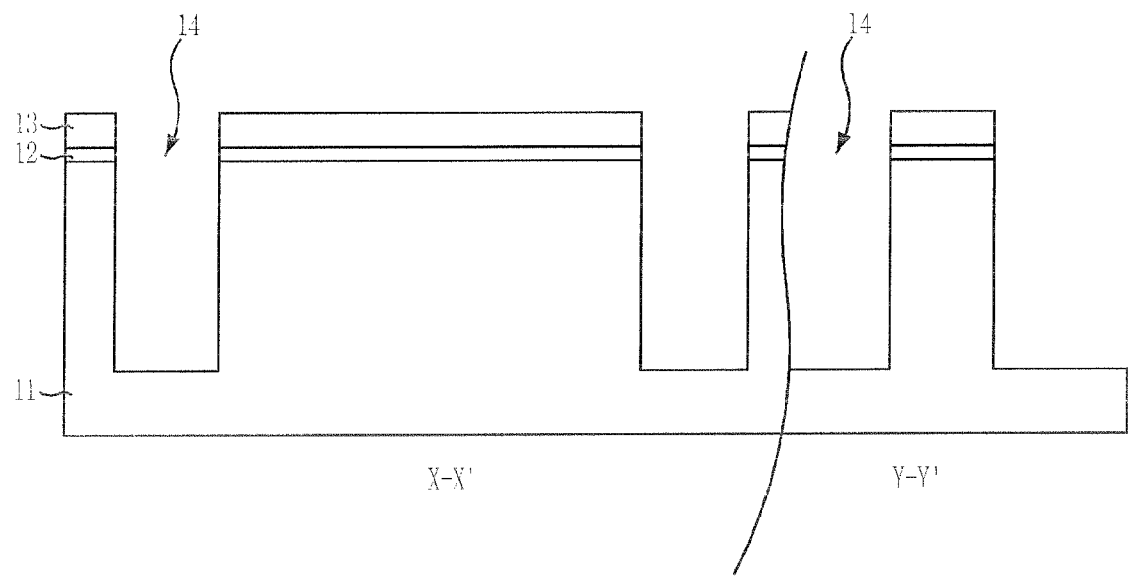
FIGS. 1A to 1D illustrate a method for fabricating a fin transistor.
Figure 1B:
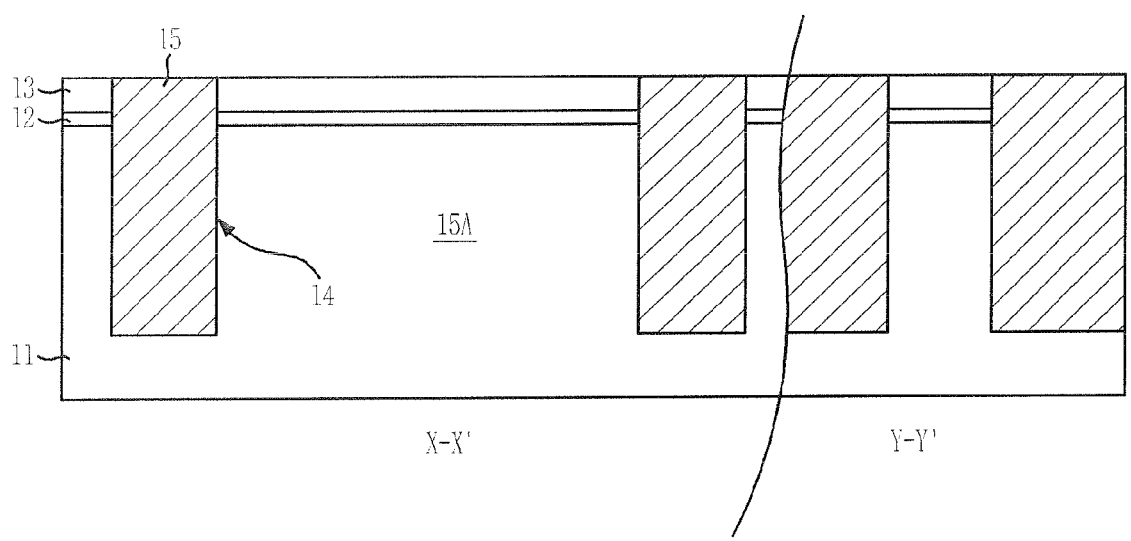
Figure 1C:
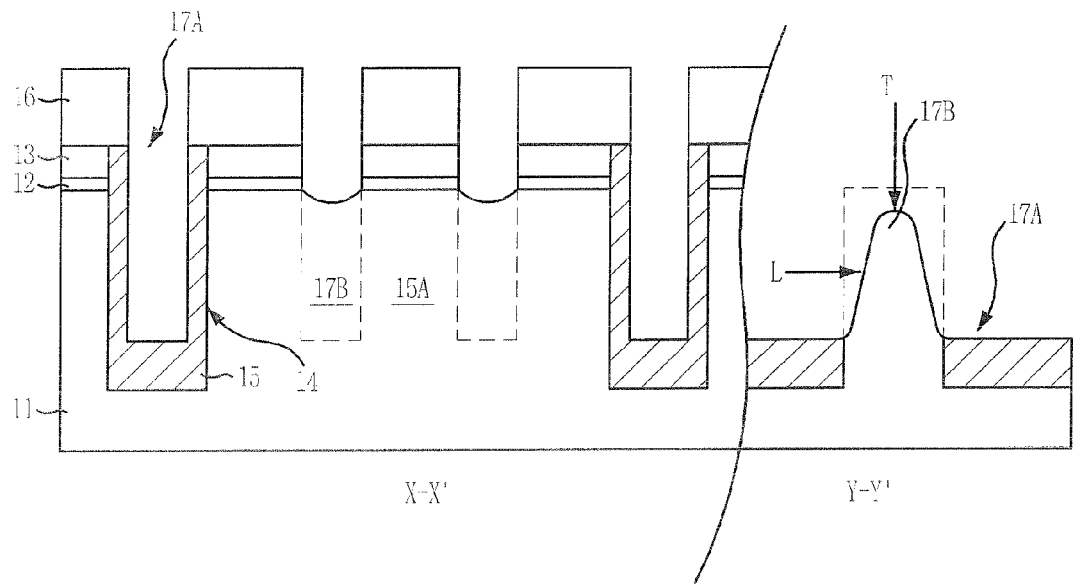
Figure 1D:
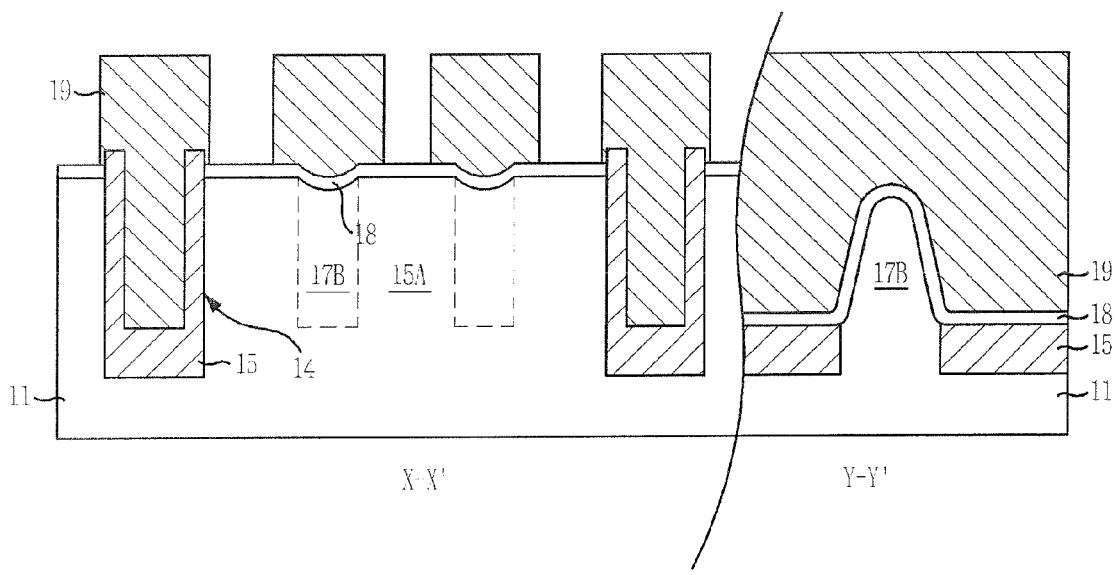
Figure 2:
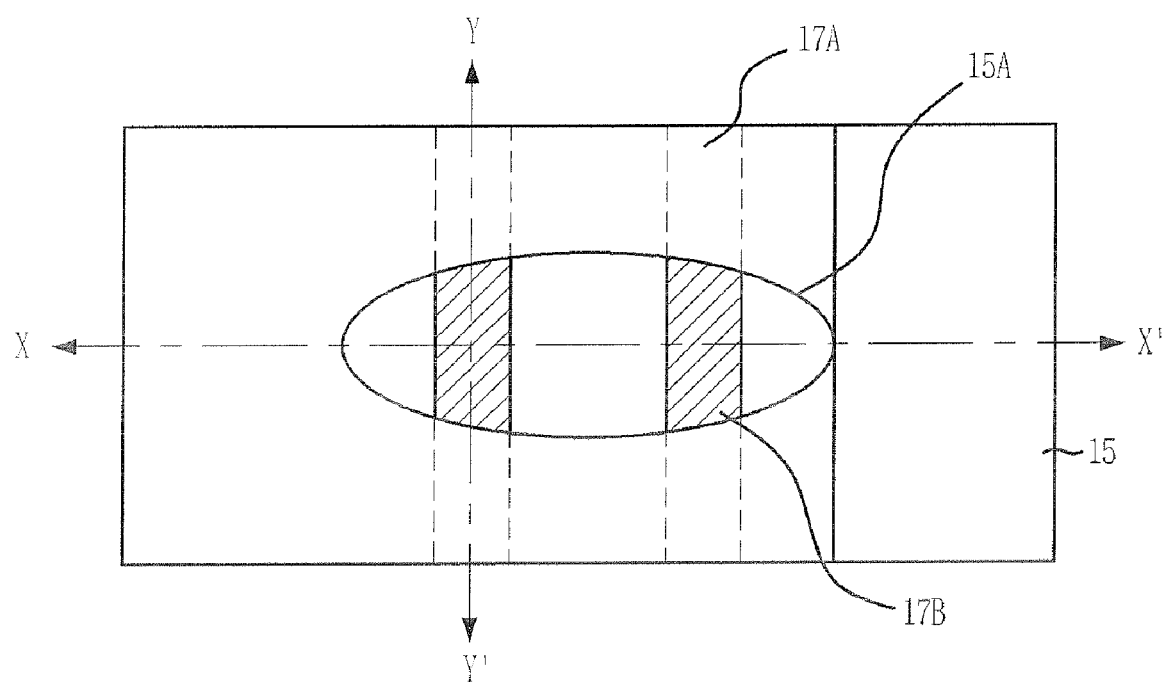
FIG. 2 illustrates a top view of the fin transistor fabricated by the method illustrated in FIGS. 1A to 1D.
Figure 3A:
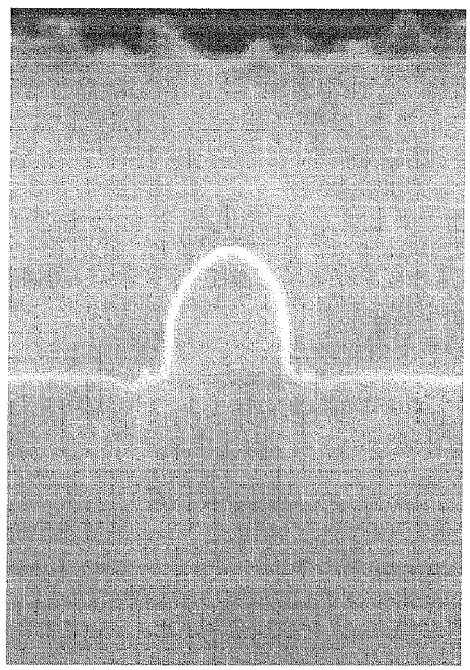
FIG. 3A illustrates an image of a fin with a damaged top portion.
Figure 3B:
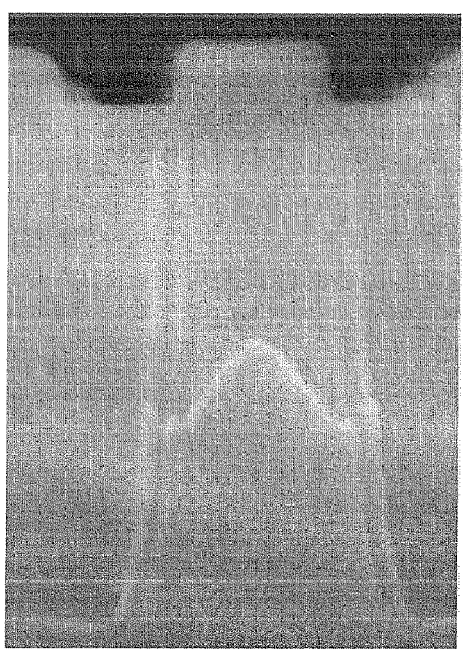
FIG. 3B illustrates an image of a saddle-type fin with a damaged top portion.
Figure 4A:
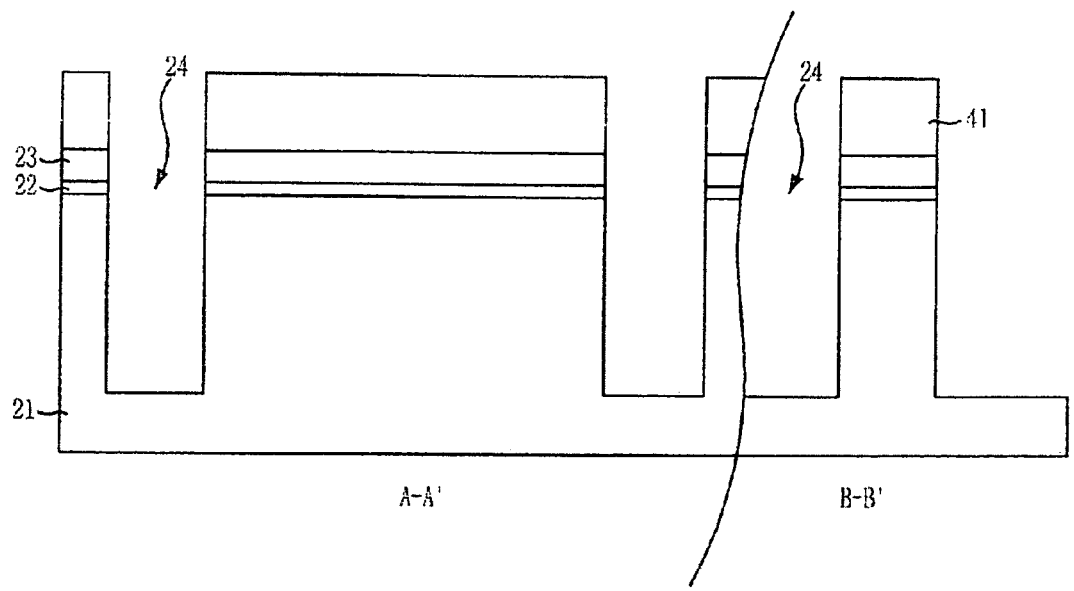
Figure 5:
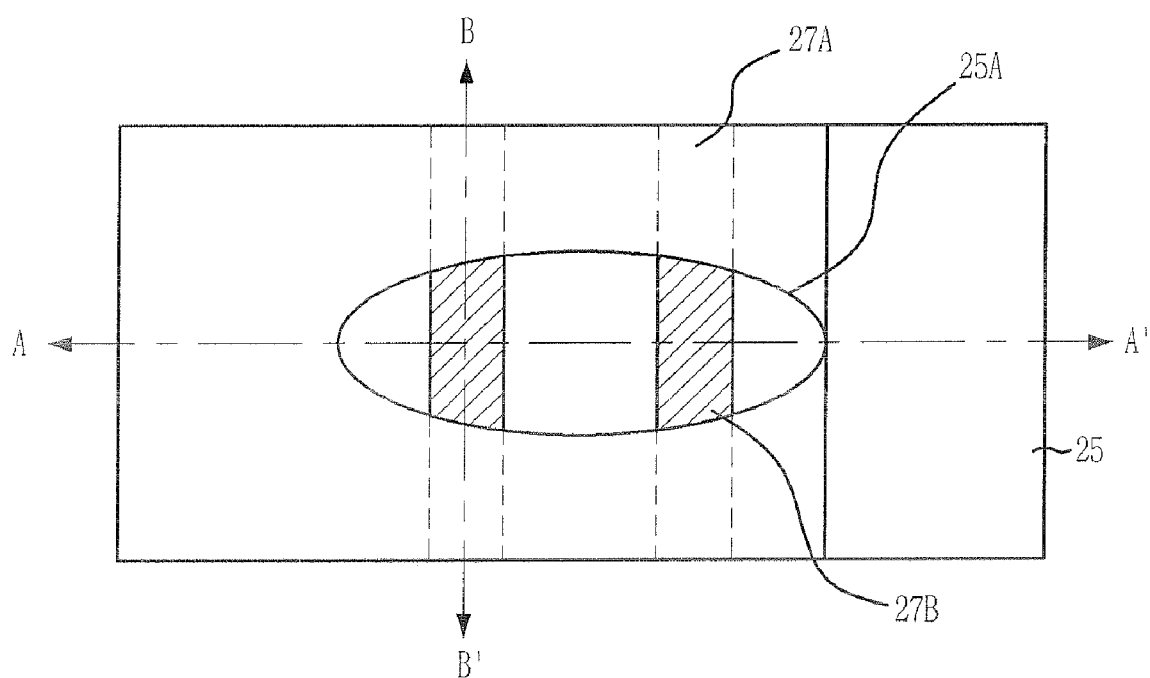
FIG. 5 illustrates a top view of the fin transistor fabricated by the method illustrated in FIGS. 4A to 4E.

Referring to FIG. 4A, a first pad layer 22 and a second pad layer 23 are formed over a substrate 21. The first pad layer 22 includes an oxide-based material, and will be referred to as the pad oxide layer hereinafter. The second pad layer 23 includes a nitride-based material, and will be referred to as the pad nitride layer hereinafter. The pad oxide layer 22 is used to relieve stress generated due to the pad nitride layer 23. The pad nitride layer 23 functions as a barrier against subsequent chemical mechanical polishing (CMP) and fin etching. The pad nitride layer 23 is formed to a thickness of approximately 100 Å or more (e.g., in a range of approximately 100 Å to 2,500 Å).

The pad nitride layer 23 and the pad oxide layer 22 are etched using an isolation mask 41 to expose isolation regions. Exposed portions of the substrate 21 are etched to a certain depth using the isolation mask 41 and the pad nitride layer 23 as an etch barrier to form trenches 24. The trenches 24 are regions into which a field oxide layer is to be filled, and has a depth of approximately 2,000 Å or more.

Figure 4B:
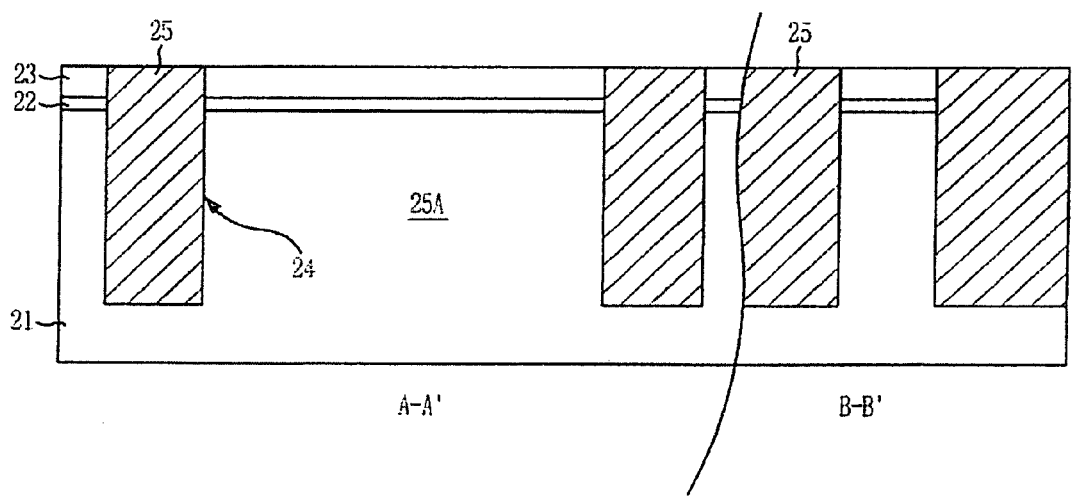

Referring to FIG. 4B, the isolation mask 41 is removed. An insulation layer, more specifically, an oxide-based layer fills the trenches 24. The oxide-based layer may be an oxide layer deposited by a high density plasma (HDP) method. Alternatively, the oxide-based layer may be formed by first coating an oxide layer by a spin-on-glass (SOG) method and depositing a HDP oxide layer thereon. The insulation layer is then chemically and mechanically polished. During the chemical mechanical polishing (CMP), the pad nitride layer 23 functions as a polishing stop layer. After the CMP, the field oxide layers 25 are formed to fill the trenches 24. The field oxide layers 25 are used for isolation and define an active region 25A.

Referring to FIG. 4C, a photoresist layer is coated over the resultant structure illustrated in FIG. 4B, and patterned through photolithography to form a mask 26. The mask 26 is formed in a line type. The mask 26 provides line-type openings in regions where gate lines are to be formed. The mask 26 simultaneously exposes portions of the active region 25A and the field oxide layers 25.

The field oxide layers 25 are recessed (or etched) to a certain depth using the mask 26. The recessed depth should be approximately 500 Å or more (e.g., in a range of approximately 500 Å to 1,500 Å). The field oxide layers 25 remain in the trenches 24 to cover the bottom surfaces of the trenches 24. In the present implementation, the mask 26 defines an opening with a width that is narrower than that of the trenches 24 in the direction along the major axis of the active region 25A. As a result, portions of the field oxide layer 25 remain on the sidewall of the trenches 24 (see cut plane A-A).

After the etching step, portions of the active region 25A protrude (or are exposed), and the protruding portions of the active region 25A are called fins 27B. Reference numeral 27A denotes open areas obtained after the field oxide layers 25 are recessed. As can be seen from FIG. 4C, the height of the fins 27B is substantially the same as the recessed depth of the field oxide layers 25, i.e., approximately 500 Å or more.

When the field oxide layers 25 are recessed by etching, an etch gas having high selectivity to the pad nitride layer 23 (i.e., self-aligned contact chemistry) is used. The term "self-aligned contact chemistry" means a condition that gives high etch selectivity of nitride with respect to oxide, so that the pad nitride layer 23 is etched minimally when the field oxide layers 25 are etched.

For instance, a carbon containing etch gas is used to etch the field oxide layers 25. In particular, the etch gas may be one of an etch gas having a high carbon content, an etch gas having a high carbon and hydrogen content, and a combination thereof.

In detail, the etch gas containing carbon may be a $C_xF_y$ gas, where $x \geq 2$ and $y \geq 1$, or a $C_xH_yF_z$ gas, where $x \geq 1$, $y \geq 2$, and $Z \geq 1$. For instance, the etch gas may be $C_2F_6$, $C_3F_8$, $C_4F_6$, $C_5F_8$, or $CH_2F$. For reference, those oxide etch gases that usually cause the loss of a top portion of a fin are $CF_4$ and $CHF_3$ gases, and theses gases has a selectivity ratio of nitride to oxide of about 1 to 1. However, the etch gas used in the present embodiment has a selectivity ratio between the pad nitride layer 23 and the field oxide layers 25 of approximately 8 to 1 or higher. Using such an etch gas, the pad nitride layer 23 remains to a certain thickness when the field oxide layers 25 are recessed. The remaining pad nitride layer 23 is labeled as 23A and will be referred to as "pad nitride pattern" hereinafter. Due to the pad nitride pattern 23A, the loss of the top portions of the fins 27B can be minimized.

Referring to FIG. 4D, the mask 26 is removed, and the pad nitride pattern 23A is removed using a wet chemical, so that etch damage to the fins 27B and the field oxide layers 25 can be prevented. For instance, the pad nitride pattern 23A is removed using phosphoric acid ($H_3PO_4$). The pad nitride layer 23 in the A-A' direction is also removed.

The pad nitride pattern 23A may also be removed simultaneously when the field oxide layers 25 are etched to form the fins 27B as described in FIG. 4C. For this simultaneous removal of the pad nitride layer 23, the pad nitride layer 23 is formed to a certain thickness to enable the fins 27B to be formed without damaging the top portions of the fins 27B. The pad nitride layer 23, however, is thin enough to be removed when the field oxide layers 25 are etched. The pad nitride layer 23 can also be removed when the pad oxide layer 22 is etched by adjusting the selectivity ratio between the pad nitride layer 23 and the field oxide layers 25 to less than 8 to 1. However, the selectivity ratio of the pad nitride layer 23 to the field oxide layers 25 should be greater than 2 to 1 to prevent damage to the fins 27B.

With the removal of the pad nitride layer 23 and pad oxide layer 22, vertical portions 25B of the field oxide layers 25 protrude above an upper surface of the substrate 21. In the present embodiment, the pad oxide layer 22 is provided below the pad nitride layer 23. However, other embodiments a single pad layer rather than multiple pad layers as in the present embodiment. The single pad layer may be nitride-based or another type of material.

Figure 4E:
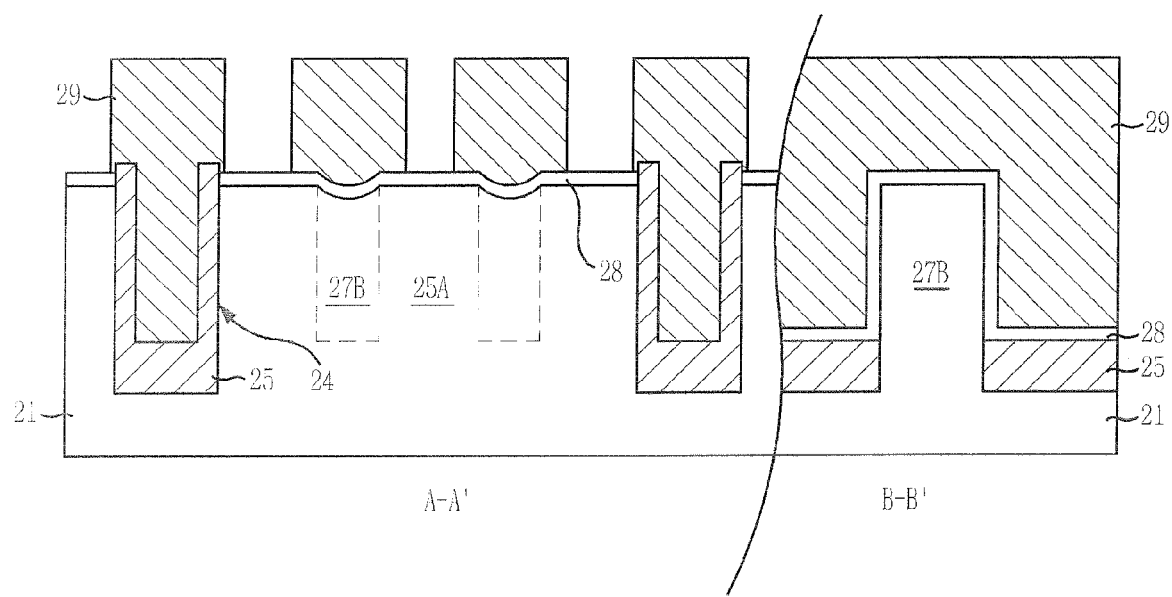

Referring to FIG. 4E, a gate insulation layer 28 (e.g. oxide-based layer) is formed over the resultant structure illustrated in FIG. 4D, and a gate material is formed over the gate insulation layer 28 and patterned to form gate electrodes 29.

Figure 6:
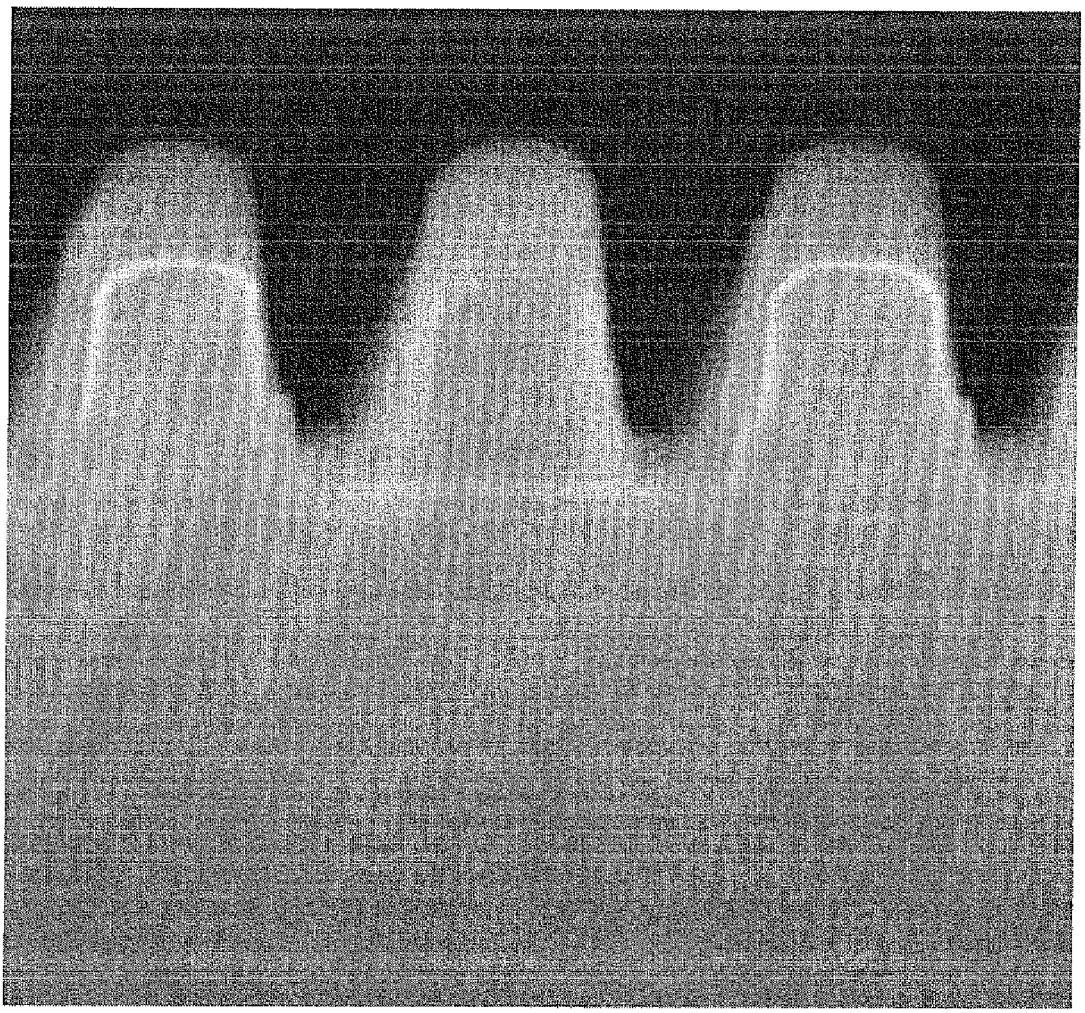
FIG. 6 illustrates an image of a fin with a damaged top portion in accordance with the embodiment of the present invention.

FIG. 6 illustrates an image of fins whose top portions are not damaged in accordance with the embodiment of the present invention. As illustrated, the loss of the top portions of the fins is minimized, and the shape of the top portion of each of the fins is rounded instead of being angular (or tapered sharply).

In accordance with the embodiment of the present invention, when the field oxide layers 25 are etched, an etch gas that has a high selectivity ratio of the pad nitride layer 23 to the field oxide layer 25 is used. As a result, the loss of the top portions of the fins 27B is minimized, and sufficient areas of the fins 27B can be secured.

FIGS. 7A to 7E are sectional views to illustrate a method for fabricating a saddle-type fin transistor in accordance with another embodiment of the present invention. FIG. 8 illustrates a top view of the saddle-type fin transistor described in FIGS. 7A to 7E. In FIGS. 7A to 7E and FIG. 8, cut plane C-C' is directed along a major axis of an active region 35A, while cut plane D-D' is directed along a region where gate electrodes (not shown) are to be formed.

Figure 7A:
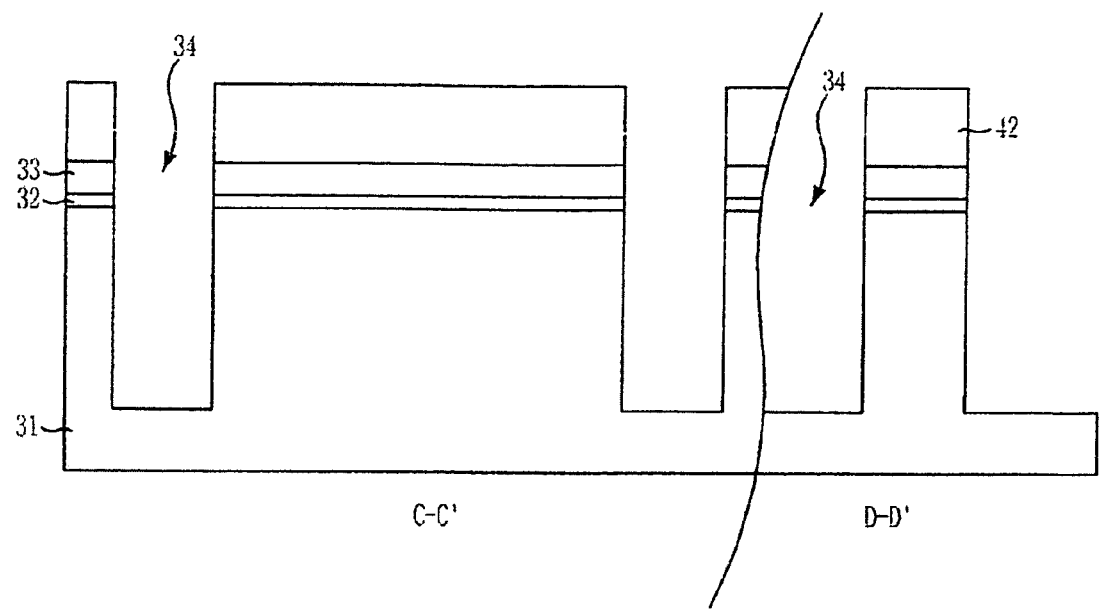
FIGS. 7A to 7E are cross-sectional views illustrating a method for fabricating a saddle-type fin transistor in accordance with another embodiment of the present invention.
Figure 8:
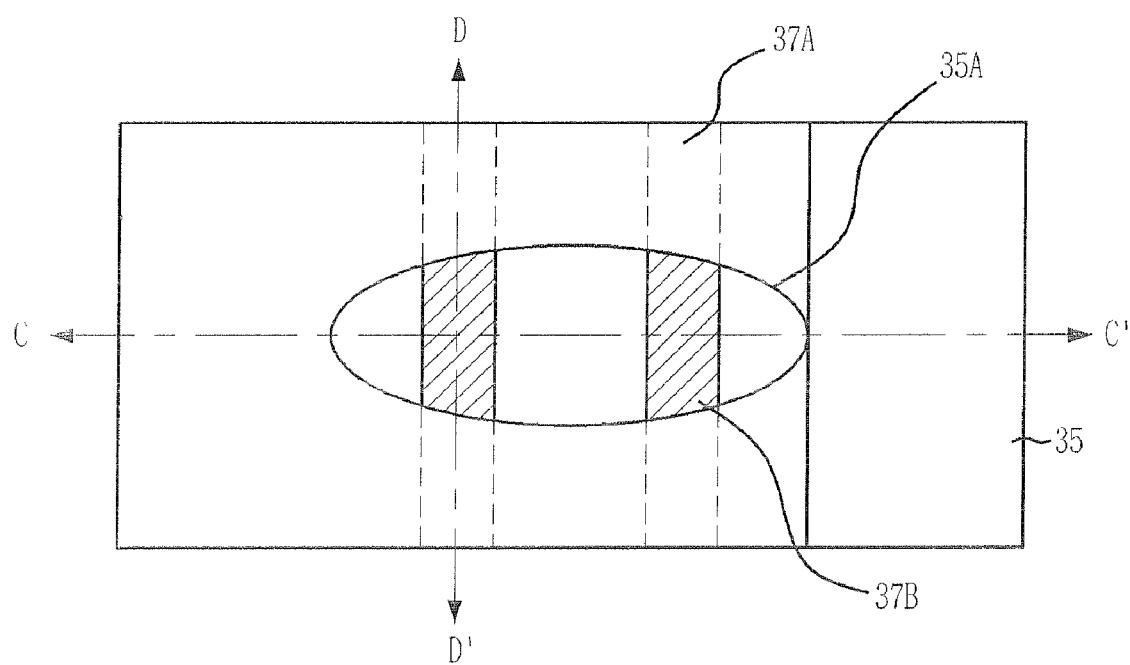
FIG. 8 illustrates a top view of the saddle-type fin transistor fabricated by the method illustrated in FIGS. 7A to 7E.

Referring to FIG. 7A, a first pad layer 32 and a second pad layer 33 are formed over a substrate 31. The first pad layer 32 includes an oxide-based material, and will be referred to as the pad oxide layer hereinafter. The second pad layer 33 includes a nitride-based material, and will be referred to as the pad nitride layer hereinafter. The pad oxide layer 32 is used to relieve stress generated by the pad nitride layer 33. The pad nitride layer 23 functions as a barrier against subsequent CMP and pin etching. The pad nitride layer 33 is formed to a thickness of approximately 100 Å or more (e.g., in a range of approximately 100 Å to 2,500 Å).

The pad nitride layer 33 and the pad oxide layer 32 are etched using an isolation mask 42. Exposed portions of the substrate 31 are etched to a certain depth using the isolation mask 42 and the pad nitride layer 33 as an etch barrier to form trenches 34. The trenches 34 are regions that will be filled with a field oxide layer, and has a depth of approximately 2,000 Å or more.

Figure 7B:
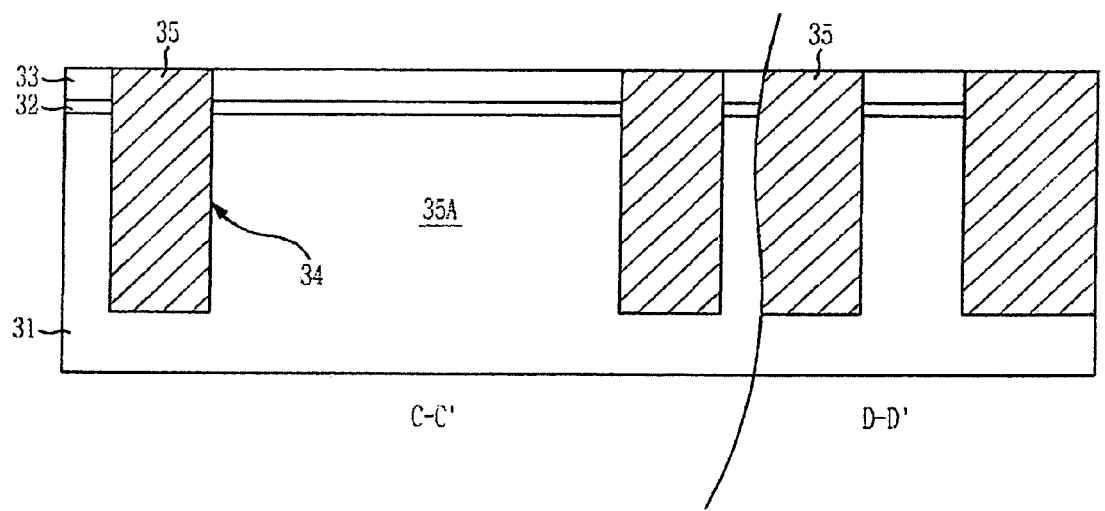

Referring to FIG. 7B, the isolation mask 42 is removed. An insulation layer, more specifically, an oxide-based layer fills the trenches 34. The oxide-based layer may be an oxide layer deposited by a HDP method. Alternatively, the oxide-based layer may be formed by first coating an oxide layer by a SOG method and then depositing a HDP oxide layer thereon. The insulation layer is chemically and mechanically polished. During the CMP, the pad nitride layer 33 functions as a polishing stop layer. After the CMP, the field oxide layers 35 are formed to fill the trenches 34. The field oxide layers 35 are used for isolation and define an active region 35A.

Figure 7C:
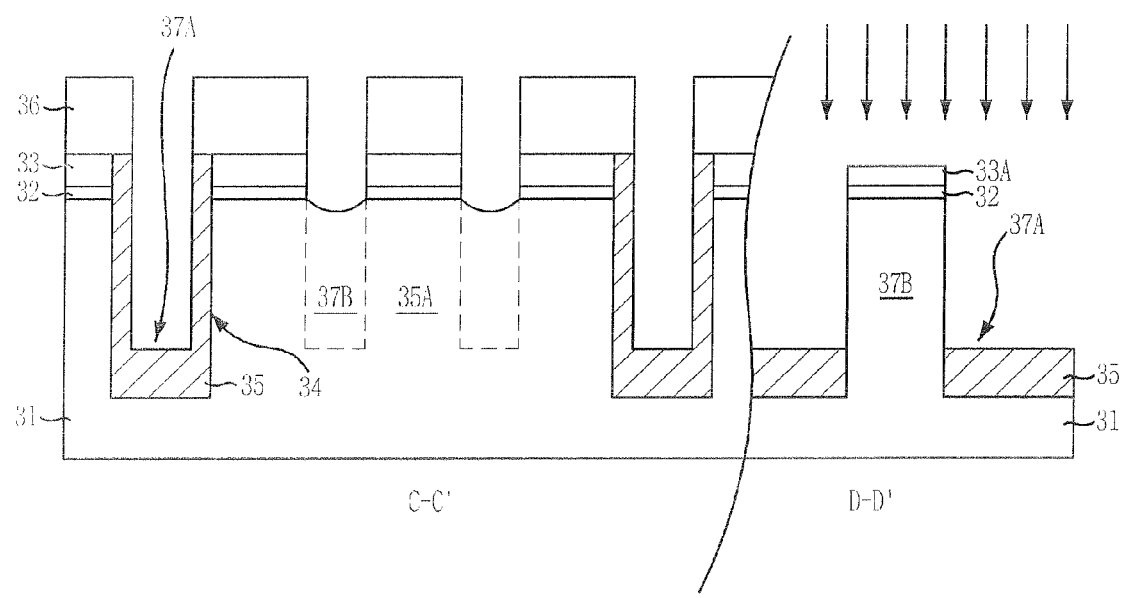

Referring to FIG. 7C, a photoresist layer is coated over the resultant structure illustrated in FIG. 7B, and patterned through photolithography to form a mask 36. The mask 36 is formed in a line type. The mask 36 provides line-type openings in regions where gate lines are to be formed. The mask 36 exposes simultaneously portions of the active region 35A and the field oxide layers 35. The mask 36 defines an opening with a narrower width than that of the trenches 34 in the direction along the major axis of the active region 35A.

The field oxide layers 35 are recessed (or etched) to a certain depth using the mask 36. The recessed depth should be approximately 100 Å or more (e.g., in a range of approximately 100 Å to 1,500 Å). As a result of the recessing, fins 37B, which are protruding active regions, are formed. The height of each of the fins 37B is 500 Å or more. Reference numeral 37A denotes recesses after the field oxide layers 35 are recessed. Reference numeral 33A denotes a remaining portion of the pad nitride layer 33 after the recessing, and will be referred to as "pad nitride pattern" hereinafter.

In the present embodiment, when the field oxide layers 35 are recessed by etching, an etch gas having high selectivity to the pad nitride layer 33 (i.e., self-aligned contact chemistry) is used. The term "self-aligned contact chemistry" means a condition that gives high etch selectivity of nitride with respect to oxide, so that the pad nitride layer 33 is etched minimally when the filed oxide layers 35 are etched.

For instance, a carbon containing etch gas is used to etch the field oxide layers 35. In particular, the etch gas may be one of an etch gas having a high carbon content, an etch gas having high carbon and hydrogen content, and a combination thereof.

In detail, the etch gas containing carbon may be a $C_xF_y$ gas, where $x \geq 2$ and $y \geq 1$, or a $C_xH_yF_z$ gas, where $x \geq 1$, $y \geq 2$, and $Z \geq 1$. For instance, the etch gas may be $C_2F_6$, $C_3F_8$, $C_4F_6$, $C_5F_8$, or $CH_2F$. For reference, those oxide etch gases that usually cause the loss of a top portion of a fin pattern are $CF_4$ and $CHF_3$ gases, and theses gases have a selectivity ratio of nitride to oxide of about 1 to 1. However, the etch gas used in the present embodiment has a selectivity ratio between pad nitride layer 33 and field oxide layers 35 of approximately 8 to 1 or higher. The loss of the top portions of the fins 37B can be minimized using such an etch gas.

Figure 7D:
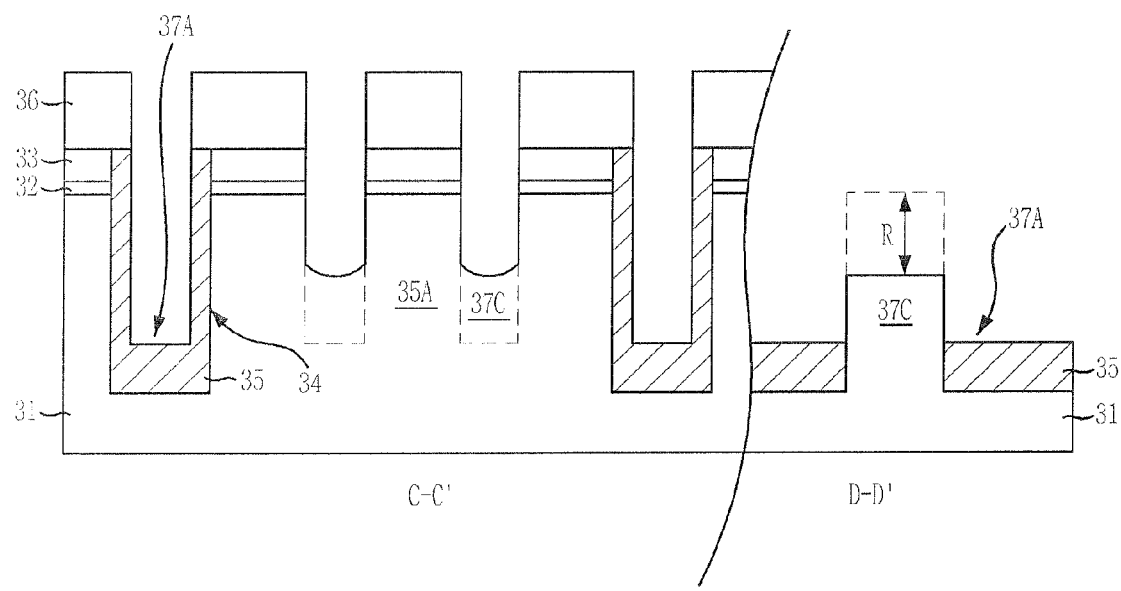

Referring to FIG. 7D, the fins 37B are recessed using the mask 36 to form saddle-type fins 37C. The recessed depth of the fins 37B is set to be less than that of the field oxide layers 35 so as to obtain the saddle-type fins 37C. For instance, the recessed depth R for forming the saddle-type fins 37C is 800 Å or more, and the maximum recessed depth is less than the recessed depth of the field oxide layers 35.

For the formation of the saddle-type fins 37C, a pad nitride pattern 33A and the pad oxide layer 32 are etched, and then the fins 37B are etched. When the fins 37B are etched (i.e., recessed), since the fins 37B include a silicon-based material, an etch gas that has a high selectivity ratio between the fins 37B and the field oxide layers 35 is used. For instance, the etch gas includes HBr gas or $Cl_2$ gas. Since loss of the fins 37B is minimized during the etching (i.e., recessing) for forming the saddle-type fins 37C, top portions of the saddle-type fins 37C are not likely to be tapered, and severe damage to side portions of the saddle-type fins 37C can be avoided.

Figure 7E:
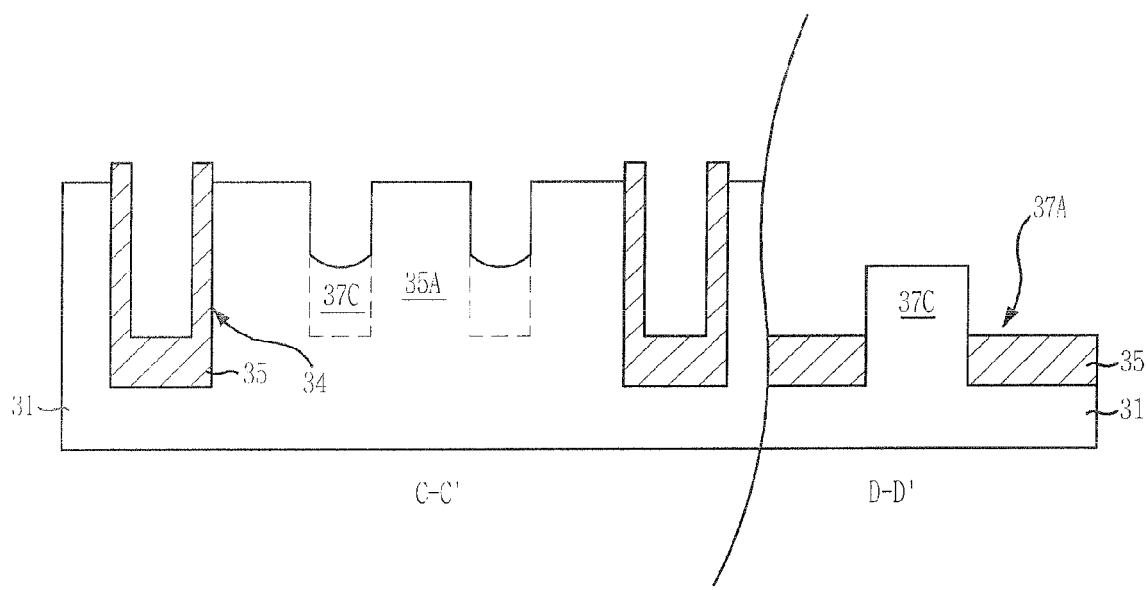

Referring to FIG. 7E, the mask 36 is removed, and the pad nitride layer 33 and the pad oxide layer 32 remaining in the C-C' direction are removed. The pad nitride layer 33 is removed using a wet chemical so that etch damage to the saddle-type fins 37C and the field oxide layers 35 are not incurred. The wet chemical may include $H_3PO_4$. Although not illustrated, a gate insulation layer (e.g., oxide-based layer) and a layer of a gate material are formed over the resultant structure illustrated in FIG. 7E, and patterned to form gate electrodes.

According to various embodiments of the present invention, an etch gas having a high selectivity ratio between the pad nitride layer and the field oxide layers is used when the field oxide layers are etched. Thus, the loss of the fins can be reduced. As a result, the shape of the fin can be reproducible. This reproducibility makes it further possible to obtain process reproducibility in fin transistor or saddle-type fin transistor fabrication processes.

While the present invention has been described with respect to certain embodiments, it will be apparent to those skilled in the art that various changes and modifications may be made without departing from the spirit and scope of the invention as defined in the following claims.

What is claimed is:

1. A method for fabricating a fin transistor, the method comprising:
   forming a pad layer including a first pad layer and a second pad layer over a substrate with a major axis of an active region;
   patterning the second pad layer provided over the first pad layer using an isolation mask;
   etching the substrate using the isolation mask and the second pad layer to form trenches;
   filling the trenches with an insulating material to form isolation structures;
   forming a plurality of masks defining an opening over the resultant structure including the isolation structures, the opening exposing portions of the active region and the isolation structures;
   etching the isolation structures within the trenches using the plurality of masks as etch masks and a gas having a high selectivity ratio of the insulating material to the second pad layer to form fin structures, wherein the insulating material remains on sidewalls of the trenches in a direction of the major axis of the active region;
   forming a gate insulating layer over the fin structures; and
   forming a conductive layer over the gate insulating layer.

2. The method of claim 1, wherein the second pad layer comprises a nitride-based material, the method further comprising:
   forming the second pad layer over the substrate, wherein the second pad layer is provided over the substrate and the first pad layer; and
   removing the second pad layer prior to forming the gate insulating layer.

3. The method of claim 2, wherein etching the isolation structures comprises using a gas including one selected from a group consisting of a gas containing a high content of carbon, a gas containing high contents of carbon and hydrogen, and a combination thereof.

4. The method of claim 3, wherein the gas containing the high content of carbon includes a $C_xF_y$ gas, where $x \geq 2$ and $y \geq 1$.

5. The method of claim 4, wherein the $C_xF_y$ gas includes one selected from a group consisting of $C_2F_6$, $C_3F_8$, $C_4F_6$, and $C_5F_8$.

6. The method of claim 3, wherein the gas containing high contents of carbon and hydrogen includes a $C_xH_yF_z$ gas, where $x \geq 1$, $y \geq 2$, and $z \geq 1$.

7. The method of claim 6, wherein the $C_xH_yF_z$ gas includes $CH_2F$.

8. The method of claim 2, wherein removing the second pad layer comprises using a wet chemical.

9. The method of claim 8, wherein the wet chemical includes a phosphoric acid ($H_3PO_4$) solution.

10. The method of claim 9, wherein the isolation structures are etched to a thickness of 500 Å or more.

11. The method of claim 1, wherein the isolation structures include oxide, wherein the fin structures are saddle-type fins structures.

12. The method of claim 1, wherein a width of the opening is less than a width of the trenches.

* * * * *